United States Patent [19]
Suzuki et al.

[11] Patent Number: 5,206,549
[45] Date of Patent: Apr. 27, 1993

[54] FREQUENCY DISCRIMINATING CIRCUIT

[75] Inventors: Tetsuya Suzuki; Hideo Hatada, both of Kanagawa, Japan

[73] Assignee: Sony Corporation, Tokyo, Japan

[21] Appl. No.: 802,409

[22] Filed: Dec. 4, 1991

[30] Foreign Application Priority Data
Dec. 20, 1990 [JP]  Japan .................... 2-412516

[51] Int. Cl.$^5$ .................... H03K 9/06; H03K 3/00
[52] U.S. Cl. .................... 307/525; 328/109; 328/138; 328/134; 377/47
[58] Field of Search .............. 307/518, 522, 523, 525, 307/527, 528; 377/47, 107, 118; 328/138, 109, 133

[56]  References Cited
U.S. PATENT DOCUMENTS
4,360,782  11/1982  Nowell .................... 307/523
4,736,162  4/1988  Ishihara .................... 307/518

Primary Examiner—Timothy P. Callahan
Attorney, Agent, or Firm—Lewis H. Eslinger; Jay H. Maioli

[57]  ABSTRACT

A frequency discriminating circuit suitable for use with a display capable of displaying image data of a plurality of signal formats and which has an oscillator for generating an oscillation frequency corresponding to a horizontal synchronizing frequency of an input signal which can be displayed. This frequency discriminating circuit includes a counter for frequency-dividing the oscillation frequency of the oscillator which is reset by a horizontal synchronizing signal, to thereby discriminate the horizontal synchronizing frequency of the input signal.

4 Claims, 1 Drawing Sheet

FIG. 1
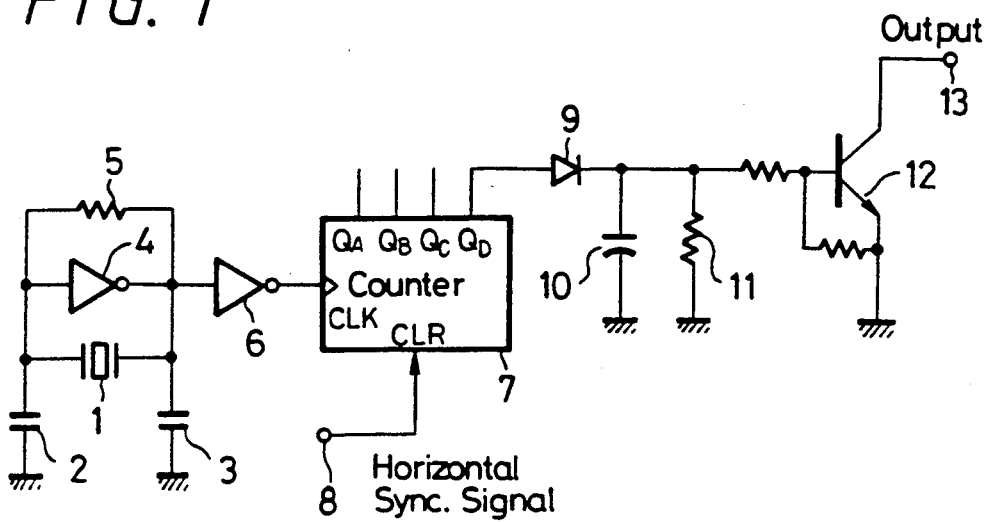
FIG. 2A
FIG. 2B
FIG. 2C
FIG. 2D
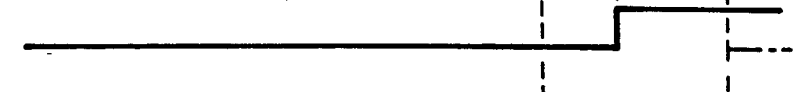
FIG. 2E
FIG. 2F
FIG. 2G

FREQUENCY DISCRIMINATING CIRCUIT

BACKGROUND OF THE INVENTION

1. Field of the Invention

The present invention generally relates to frequency discriminating circuits and, more particularly, is directed to a frequency discriminating circuit for use in a display device which displays image signals of a plurality of signal formats.

2. Description of the Prior Art

Image signals from computers, for example, have a variety of formats in which the horizontal synchronizing frequencies thereof are 47 kHz or 63 kHz. Accordingly, in a display device which displays image signals of plurality of signal formats, circuits within the display device must be switched in response to the horizontal synchronizing frequency of the input signal, otherwise the synchronization of the picture is disordered and a picture cannot be displayed satisfactorily.

To remove the above-mentioned disadvantage, the conventional display device is provided with a manual switch, for example, and the user switches this manual switch in response to the horizontal synchronizing frequency of the input signal in a manual fashion. This method in which the user switches the manual switch in a manual fashion, however, forces the user to do extra work. Particularly when computers having a variety of formats are switched in use, the work becomes complex. Further, if the user forgets the switching of the computers, there is then the risk that the user will misunderstand this state as a fault or the like.

OBJECTS AND SUMMARY OF THE INVENTION

Accordingly, it is an object of the present invention to provide an improved frequency discriminating circuit in which the aforementioned shortcomings and disadvantages of the prior art can be eliminated.

More specifically, it is an object of the present invention to provide a frequency discriminating circuit of simplified arrangement for use with a display device which can carry out satisfactory frequency discrimination.

It is another object of the present invention to provide a frequency discriminating circuit which can be made inexpensive.

As an aspect of the present invention, a frequency discriminating circuit suitable for use with a display capable of displaying a plurality of signal formats is comprises of an oscillator having an oscillation frequency corresponding to a horizontal synchronizing frequency of an input signal which can be displayed, a counter for frequency-dividing the oscillation frequency of the oscillator, and a terminal to which a horizontal synchronizing signal is applied, in which the counter is reset by the horizontal synchronizing signal to thereby discriminate the horizontal synchronizing frequency of the input signal.

BRIEF DESCRIPTION OF THE DRAWINGS

A better understand of the objects, features and advantages of the invention can be gained from a consideration of the following detailed description of the preferred embodiment thereof, in conjunction with the figures of the accompanying drawings, wherein:

FIG. 1 shows a circuit diagram of an embodiment of the frequency discriminating circuit according to the present invention; and FIGS. 2A through 2G shows timing charts used to explain operation of the frequency discriminating circuit shown in FIG. 1.

DESCRIPTION OF THE PREFERRED EMBODIMENT

The present invention will now be described with reference to the accompanying drawings.

Referring to FIG. 1, a quartz oscillator 1 is provided to oscillate at a frequency of 3.58 MHz which is a reference frequency of a chroma signal of, for example, a television signal. Both ends of the quartz oscillator 1 are respectively grounded through capacitors 2 and 3 (10 pF) and connected with a parallel circuit of an inverter 4 and a resistor 5 (1 MΩ). One end of the quartz oscillator 1 is coupled through an inverter 6 to a clock input terminal CLK of a counter 7 and a clear terminal CLR of the counter 7 is coupled to a terminal 8 to which a horizontal synchronizing signal is supplied. A fourth output terminal $Q_D$ of the counter 7 is coupled through a diode 9 to one end of a parallel circuit of a capacitor 10 (4.7 μF/50V) and a resistor 11 (4.7 kΩ) and the other end of this parallel circuit is grounded. Further, the one end of this parallel circuit is connected to the base of an npn transistor 12 whose emitter is grounded, and an output terminal 13 is led out from the collector of this npn transistor 12.

In the above-mentioned circuit arrangement, the oscillator 1 generates a signal of 3.58 MHz and if this oscillation signal is divided by 8, then a divided signal shown, for example, in FIG. 2A is generated. This divided signal is supplied to the clock input terminal CLK of the counter 7, whereby divided signals shown in FIGS. 2B through 2E are developed at output terminals $Q_A$, $Q_B$, $Q_C$ and $Q_D$ of the counter 7, respectively. The signal developed at the output terminal $Q_D$ is inverted at the cycle of 1/56 (kHz) as shown in FIG. 2E.

The horizontal synchronizing signal supplied to the terminal 8 is inverted at the cycle of 1/47 (kHz) as shown in FIG. 2F if the horizontal synchronizing frequency of the input signal is 47 kHz, in which case, the counter 7 is reset after the signal developed at the output terminal $Q_D$ is inverted. If on the other hand the horizontal synchronizing frequency of the input signal is 63 kHz, then the horizontal synchronizing signal supplied to the terminal 8 is inverted at the cycle of 1/63 (kHz) as shown in FIG. 2G, in which case, the counter 7 is reset before the signal developed at the output terminal $Q_D$ is inverted.

Accordingly, this circuit generates a pulse signal cyclically when the frequency of the input horizontal synchronizing signal fed to the terminal 8 is 47 kHz and generates an output of a predetermined potential when the frequency of the input horizontal synchronizing signal is 63 kHz. This output signal is rectified by a diode 9 and fed to the base of the npn transistor 12, the emitter of which is grounded. Thus, the transistor 12 generates at its open collector an output signal of low level when the horizontal synchronizing frequency of the input signal is 47 kHz and an output signal of high level when it is 63 kHz.

As described above, according to the above-mentioned embodiment of the present invention, the counter 7, which frequency-divides the oscillation frequency of the oscillator 1, is reset by the horizontal synchronizing signal (applied to the terminal 8), whereby the frequency can be discriminated by the simple circuit configuration.

If the switching of the circuit is performed by using this discriminated signal, then a satisfactory display can be constantly carried out without forcing the user to do extra work. This can facilitate the contents of the work particularly when computers having various formats are switched in use. Further, there is then no risk that the user misunderstands the situation as if there was a fault when the user forgets the switching of the computers.

In the above-mentioned circuit, the total sum of assembly parts is 15 formed of two ICs, four resistors, six capacitors, one diode, one oscillator and one transistor, including a resistor necessary for dividing the voltage of the personal computer and from +12V line to a voltage of +5V for TTL (transistor-to-transistor logic). In actual practice, the cost of the circuit parts is about 140 yen if the oscillator is formed of quartz oscillator and is about 95 yen if the oscillator is formed of ceramic oscillator.

According to the present invention, the counter 7, which frequency-divides the oscillation frequency of the oscillator 1, is reset by the horizontal synchronizing signal (applied to the terminal 8), whereby the frequency can be discriminated by the simple circuit configuration.

Having described the preferred embodiment of the invention with reference to the accompanying drawings, it is to be understood that the invention is not limited to that precise embodiment and that various changes and modifications thereof could be effected by one skilled in the art without departing from the spirit or scope of the novel concepts of the invention as defined in the appended claims.

What is claimed is:

1. A frequency discriminating circuit suitable for use with a display capable of displaying a plurality of signal formats respectively employing horizontal synchronizing signals of different frequencies, the frequency discriminating circuit comprising:
   an oscillator having an oscillation frequency higher than the frequencies of said horizontal synchronizing signals;
   a counter for frequency-dividing the oscillation frequency of said oscillator to produce a frequency-divided signal; and
   a terminal to which a selected one of said horizontal synchronizing signals is applied, in which said counter is reset by said selected horizontal synchronizing signal;
   said frequency-divided signal having a frequency intermediate the frequencies of said horizontal synchronizing signals to thereby discriminate between said horizontal synchronizing signals.

2. The frequency discriminating according to claim 1, wherein said oscillator is a quartz oscillator which generates a reference frequency of 3.58 MHz.

3. The frequency discriminating circuit according to claim 1, wherein the frequency of the selected one of said horizontal synchronizing signals is 47 kHz or 63 kHz.

4. The frequency discriminating circuit according to claim 1, further comprising a transistor which is supplied with an output signal from said counter and generates an output signal to be used for switching circuit elements.

* * * * *

UNITED STATES PATENT AND TRADEMARK OFFICE
CERTIFICATE OF CORRECTION

PATENT NO. : 5,206,549
DATED : April 27, 1993
INVENTOR(S) : Tetsuya Suzuki, Hideo Hatada It is certified that error appears in the above-indentified patent and that said Letters Patent is hereby corrected as shown below:

```
Col. 1, line 51, delete "is"
        line 52, delete "of"

Col. 4, line 23, after "discriminating" insert --circuit--
```

Signed and Sealed this

Fourth Day of October, 1994

Attest:

BRUCE LEHMAN

*Attesting Officer*     *Commissioner of Patents and Trademarks*